United States Patent

[11] 3,607,466

[72] Inventor Masayoshi Miyazaki
Kanagawa-ken, Japan
[21] Appl. No. 777,619
[22] Filed Nov. 21, 1968
[45] Patented Sept. 21, 1971
[73] Assignee Sony Corporation
Tokyo, Japan
[32] Priority Nov. 22, 1967
[33] Japan
[31] 42/75053

[54] METHOD OF MAKING SEMICONDUCTOR WAFER
6 Claims, 12 Drawing Figs.

[52] U.S. Cl. 148/175, 29/576, 29/580, 117/106, 117/201, 117/212, 148/174, 148/191, 313/68, 317/234, 317/235
[51] Int. Cl. H01l 7/36, H01l 5/00, C23c 13/00
[50] Field of Search 148/174, 175; 117/106, 107.2, 201, 212; 317/234, 235; 29/576, 580

[56] References Cited

UNITED STATES PATENTS

| | | | |
|---|---|---|---|
| 3,189,973 | 6/1965 | Edwards et al. | 148/175 X |
| 3,308,354 | 3/1967 | Tucker | 317/234 |
| 3,326,729 | 6/1967 | Sigler | 148/175 |
| 3,357,871 | 12/1967 | Jones | 148/175 |
| 3,433,686 | 3/1969 | Marinace | 148/175 |
| 3,471,922 | 10/1969 | Legat et al. | 29/580 |
| 3,475,661 | 10/1969 | Iwata et al. | 317/234 |

*Primary Examiner*—L. Dewayne Rutledge
*Assistant Examiner*—W. G. Saba
*Attorneys*—Albert C. Johnston, Robert E. Isner, Lewis H. Eslinger and Alvin Sinderbrand ABSTRACT: A semiconductor wafer may be made extremely thin, for example, so as to be suitable for use as a solid target of enhanced sensitivity in a vidicon tube, by forming on the marginal portion of one side of a single crystal semiconductor substrate a seeding site which is crystallographically different from the substrate, coating that one side of the substrate with a vapor growth layer of the same conductivity type as the substrate to consist of a polycrystalline region overlying the seeding site and a single crystal region directly overlying the remainder of that side of the substrate, and then removing the semiconductor substrate from the vapor growth layer, as by grinding, to leave a semiconductor wafer of a thickness substantially determined by the thickness of the vapor growth layer and in which cracks that may originate at the edge of wafer, either during grinding or otherwise, are blocked from spreading into the single crystal region at the boundary of the latter with the marginal polycrystalline region. The semiconductor substrate is preferably of a high impurity type so that the concentration of impurity in the single crystal region of the semiconductor wafer produced as aforesaid increases across the thickness of the wafer in the direction toward the surface thereof from which the substrate has been removed.

PATENTED SEP 21 1971 3,607,466

INVENTOR.
MASAYOSHI MIYAZAKI

BY

ATTORNEYS

METHOD OF MAKING SEMICONDUCTOR WAFER

This invention relates generally to semiconductor wafers and methods of making the same, and more particularly is directed to a method by which extremely thin semiconductor wafers can be made.

In a solid vidicon-target made by forming junctions in a semiconductor wafer, it is desirable to minimize the thickness of the semiconductor wafer making up the target so as to provide for enhanced sensitivity. A conventional method of making such a semiconductor wafer is to cut out a sheet of semiconductor from a semiconductor crystal and to cut and grind it to reduce its thickness thereby to obtain a flat and thin semiconductor wafer. However, such method encounters difficulties, such as cracking of the sheet of semiconductor from its periphery or marginal edge during the cutting and grinding operations, and accordingly this conventional method results in considerable waste of the costly semiconductor material. Further, the cracking tendency increases with a decrease in the thickness of the sheet, and thus it has not been possible heretofore to produce a semiconductor wafer having a thickness as small as 30 microns.

Accordingly, one object of this invention is to provide a method by which a thin semiconductor wafer can be made without waste of the semiconductor material by reason of the need to discard formed wafers due to cracking thereof from the perimeter during the manufacturing operations.

Another object is to provide a method of making a semiconductor wafer which is suitable for use as the solid target of a vidicon tube.

Still another object is to provide a method of making a semiconductor wafer to form one or more transistors and by which the resulting transistors have low collector resistance.

In accordance with this invention, a semiconductor wafer may be made extremely thin, for example, so as to be suitable for use as a solid target of enhanced sensitivity in a vidicon tube or image pickup device, by forming on the marginal portion of one side of a single crystal semiconductor substrate a seeding site which is crystallographically different from the substrate, coating that one side of the substrate with a vapor growth layer of the same conductivity type as the substrate to consist of a polycrystalline region overlying the seeding site and a single crystal region directly overlying the remainder of that side of the substrate, and then removing the semiconductor substrate from the vapor growth layer, as by grinding, to have a semiconductor wafer of a thickness substantially determined by the thickness of the vapor growth layer and in which cracks that may originate at the edge of the wafer, either during the grinding or other operations, are blocked from spreading into the single crystal region at the boundary of the latter with the marginal polycrystalline region.

It is another feature of this invention to employ as the aforementioned substrate a semiconductor material of a high impurity type so that, upon the deposition of the vapor growth layer on such substrate, the concentration of the impurity in the single crystal region of the vapor growth layer will increase across the thickness of the latter in the direction toward the substrate.

The above, and other objects, features and advantages of this invention, will become apparent from the following detailed description of illustrative embodiments which is to be read in connection with the accompanying drawings, wherein.

Figures 1A, 1B, 1C, 1D, 1E, 2, 3, 4, 5A, 5B, 6A, 6B:
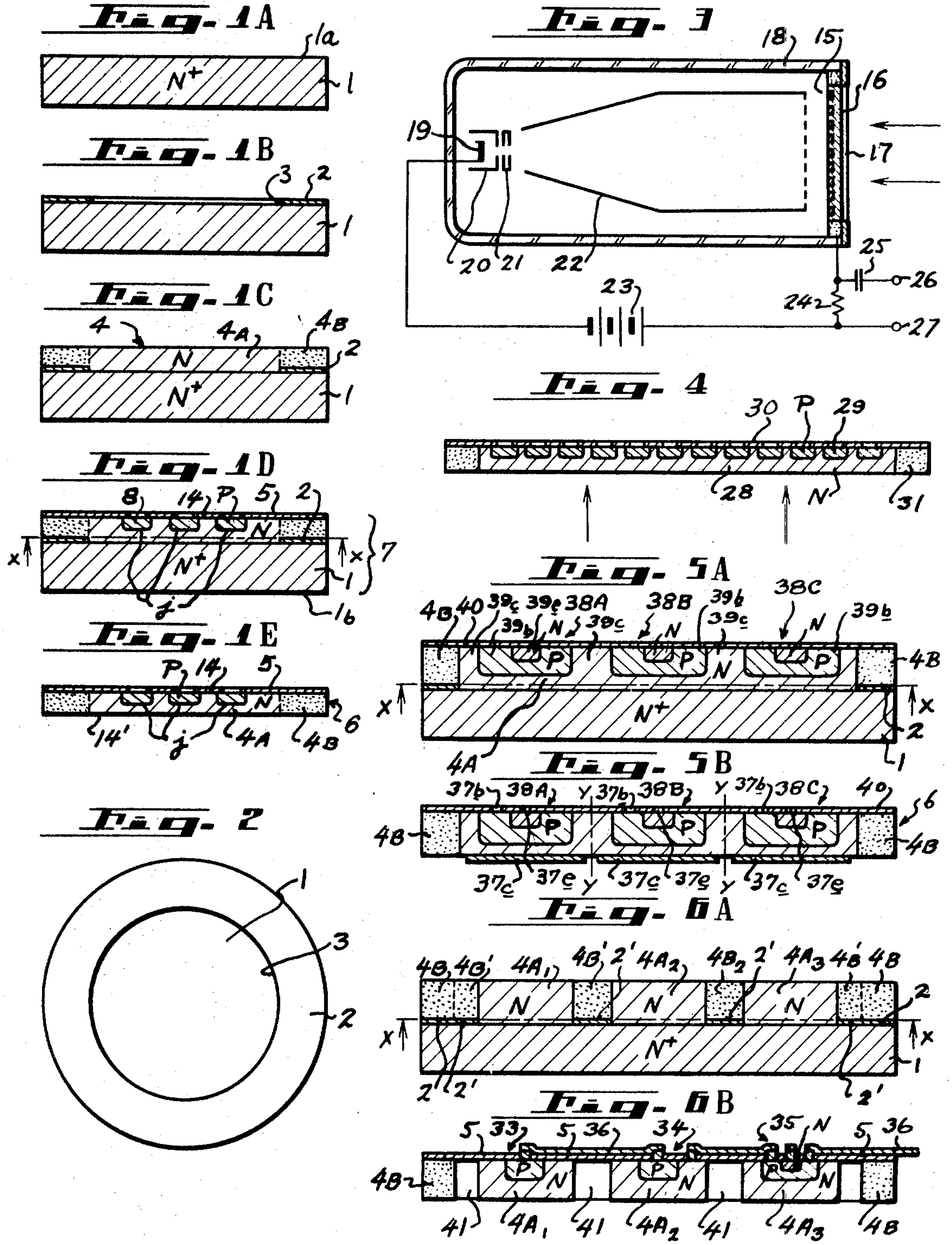
FIGS. 1A to 1E are cross-sectional views, on a greatly enlarged scale, illustrating the successive steps involved in the manufacture of a semiconductor wafer according to one embodiment of this invention.
FIG. 2 is an enlarged plan view of a wafer element resulting from the step of the process shown on FIG. 1B.
FIG. 3 is a schematic diagram showing the construction of an image pickup device employing a semiconductor target produced according to this invention.
FIG. 4 is an enlarged cross-sectional view of the semiconductor target employed in the image pickup device of FIG. 3.
FIGS. 5A and 5B are enlarged cross-sectional views showing two stages in the manufacture of transistors according to this invention.
FIGS. 6A and 6B are enlarged cross-sectional views, similar to those of FIGS. 5A and 5B, but showing two stages in the manufacture of an integrated circuit in accordance with this invention.

Referring in detail to FIG. 1, it will be seen that, in the manufacture of a semiconductor wafer according to this invention, as there illustrated, the first step is to provide a platelike single crystal substrate 1 (FIG. 1A) which has a thickness of for example, approximately 180 microns. The substrate 1 is formed of, for example, a silicon single crystal having a lattice constant which is the same as that of a single crystal semiconductor to be subsequently formed on the substrate 1 is formed 1, and at least one surface 1*a* of the substrate 1 is treated to be flat and smooth. In the illustrated embodiment, the substrate 1 may be formed of a high impurity concentration silicon single crystal of one conductivity type, for example, of N-type conductivity.

A seeding site 2, which is crystallographically different from the substrate 1, is formed over the entire marginal portion of the substrate 1 at one side of the latter and may be of annular, square or other suitable form, as depicted on FIGS. 1B and 2. The seeding site 2 may be formed with a thickness of 1,000 A. to 8,000 A., by thermal decomposition or vapor deposition of, for example, silicon oxide, or by oxidation of the surface of the substrate 1 by heating in the event that the substrate 1 has been formed of silicon. The seeding site 2 may be provided on only the marginal portion of substrate surface 1*a* by the steps of forming a layer over the entire area of the surface 1*a*, and then selectively removing such layer at the central portion of the substrate 1 by photoetching techniques to form therein a window 3 exposing the central portion of the surface 1*a*.

Thereafter, the surface 1*a* of the substrate 1 including the seeding side 2 is coated, by the usual vapor growth techniques, with, for example, an N-type silicon of the same conductivity type as the substrate 1, to form thereon a vapor growth semiconductor layer 4 of a thickness, for example, of 10 to 20 microns, substantially corresponding to the desired thickness of the semiconductor wafer, thus providing a wafer element as shown on FIG. 1C. The central portion or region 4A of vapor growth semiconductor layer 4 which is directly formed on substrate 1 through the window 3 of the seeding site 2 is a single crystal semiconductor layer, while the annular marginal portion or region 4B of layer 4 which overlies seeding site 2 is a polycrystalline semiconductor. Thus, in the resulting vapor growth semiconductor layer 4, the single crystal semiconductor region 4A is mechanically integrated with the polycrystalline semiconductor region 4B which is crystallographically different therefrom but surrounds the region 4A at the periphery of the layer 4. The diameter of the semiconductor layer 4 may be selected to be about 22mm. and the radial width of the annular polycrystalline semiconductor region 4B may be selected to be approximately 3mm.

Subsequent to the formation of the semiconductor layer 4, an impurity of conductivity type opposite to that of the single crystal semiconductor region 4A, that is, a P-type impurity, may be selectively diffused into the region 4A from the upper surface 14 of the layer 4 to form therein P-type regions 8 and consequently junctions *j* as depicted on FIG. 1D. As shown, an insulating material layer 5, for example, of silicon oxide, may be applied over layer 4 and have openings or windows photoetched therein to serve as a mask for the selective diffusion into region 4A of the P-type impurity used for formation of P-type regions 8. When the substrate 1 is of a high impurity type, for example, an N-type high impurity concentration semiconductor material, the impurity concentration semiconductor mate of the single crystal semiconductor region 4A directly grown on the substrate 1 increases across the thickness of layer 4 in the direction toward substrate 1, since the impurity is diffused from substrate 1 into region 4A by the heating employed in the vapor growth process for depositing layer 4.

After the formation of junctions *j* the resulting wafer element 7 is cut and ground, for example, by means of a grinder, from the underside 1*b* of substrate 1 up to the plane X—X indicated in broken lines on FIG. 1D to remove at least the substrate 1 and preferably also the seeding site 2. Thus, a semiconductor wafer 6 (FIG. 1E) is provided which consists of only the semiconductor vapor growth layer 4 and the insulator layer 5, and thus has a thickness substantially determined by the thickness of layer 4, for example, approximately 10 to 20 microns.

With the above-described method according to the invention, even if cracks originate at the periphery of wafer 6 during the cutting and grinding operation for removing substrate 1, such cracks are made terminate at the boundary between single crystal semiconductor region 4A and the peripheral polycrystalline semiconductor region 4B and are prevented from extending into the central portion of wafer 6, that is, into the single crystal semiconductor region 4A. The blockage of the spreading of cracks into the single crystal region 4A from the polycrystalline region 4B results from the fact that such regions are of the same thickness and are discontinuous to each other crystallographically. Further, since the regions 4A and 4B are formed integrally of the same material, though different in their crystalline structure, such regions have the same coefficient of thermal expansion and other mechanical properties so that the boundary between regions 4A and 4B is not subjected either to cracking or to mechanical distortion and the junctions *j* are not broken.

When the wafer element 7 has been cut and ground to plane X—X (FIG. 1D) to expose the under surface of single crystal region 4A and of polycrystalline region 4B, a pattern due to the differences in the crystalline structures of regions 4A and 4B can be seen, and such pattern, when observed, indicates that substrate 1 and seeding site 2 have been removed, and that the cutting and grinding operation is to be stopped. Accordingly, if the thickness of the semiconductor layer 4 deposited by the vapor growth process is selected to correspond substantially to that of the desired final wafer; the final wafer 6 will have the desired thickness.

The effectiveness of the present method in preventing cracks from extending into the single crystal region 4A as described above, makes it possible to produce a wafer having a thickness as small as about 10 microns which is very substantially thinner than that obtainable with the prior methods. Such thin semiconductor wafer, when used for the target of a vidicon tube provides enhanced sensitivity of the target. Further, by gradually increasing the impurity concentration of the semiconductor layer 4 toward the face 14' from which the substrate 1 has been removed, for example, by imparting high impurity concentration to the substrate 1 as described above, the sensitivity of the vidicon-target can be further increased.

Referring now to FIG. 3, it will be seen that, in an image pickup tube employing a semiconductor target plate 15 produced according to this invention, plate 15 is secured to a transparent faceplate 17 through a signal electrode 16 of a transparent conductive film and is then sealed within an envelope 18. In the envelope 18 there is provided a known electron gun consisting of a cathode 19 for emitting an electron beam, directed toward target plate 15, a control grid 20 for controlling the intensity of the beam, a focusing electrode 21 by which the beam is focused on target plate 15, and an electrode 22 supporting a mesh screen stretched across the tube near target plate 15 to ensure that the electron beam will approach the target in a perpendicular manner as the beam is made to scan the target plate by deflection coils (not shown). A constant voltage source 23 and a signal load resistor 24 are connected in series between signal electrode 16 and cathode 19. The signal electrode 16 is held at a positive potential relative to cathode 19 and the image signal produced in the image pickup tube appears between an output terminal 26 connected through a capacitor 25 to one end of signal load resistor 24 and an output terminal 27 connected to the other end of resistor 24.

Referring to FIG. 4, it will be seen that the target plate 15 produced according to the method described with reference to FIG. 1 for use in an image pickup tube of the type shown on FIG. 3 includes an N-type semiconductor single crystal region 28 and P-type semiconductor regions 29 formed by diffusing a P-type impurity into the region 28 from the surface of the latter to be scanned. The P-type semiconductor regions 29 are provided in an array or mosaic form so as to be independent of one another, that is, separated by intervening parts of region 28. Semiconductor oxide layers 30 are provided on the scanned surface of region 28 for preventing PN junctions from being exposed at the scanned surface, whereby to stabilize the characteristic and to prevent direct bombardment of the beam on the N-type semiconductor region. The P-type semiconductor regions 29 are buried in the common N-type semiconductor single crystal region 28 through the PN junctions. Finally, target 15 is shown to have a peripheral polycrystalline region 31 which corresponds to the region 4B of FIG. 1E.

An image pickup tube employing the target plate 15 is constructed so that, when no light is directed against the target plate 15, the mosaic of P-type semiconductor regions 29 discharge a little due to a dark current in the intervals between successive scans of the regions 29 by the electron beam, but the charges of the regions 29 of target plate 15 are held substantially constant when no light is directed against the target plate by sufficiently decreasing the dark current and by selecting the discharge time constants to be greater than the intervals of the repetitive scanning.

With the above arrangement, scanning of target plate 15 with the electron beam leads to stabilization of the P-type semiconductor regions 29 at the potential of cathode 19 (in the case of low speed scanning), thereby producing a potential difference between the P-type semiconductor regions 29 and the common N-type semiconductor single crystal region 28.

When a light image is suitably focused on target plate 15 through faceplate 17 and transparent signal electrode 16, electron-hole pairs are produced by the absorption of light quantum energy in the target plate 15, and the holes produced in the N-type semiconductor single crystal region 28 are made to flow into the P-type semiconductor regions 29, by an electric field in a space-charge region, and remain in regions 29. By reason of these holes the potential of P-type semiconductor regions 29 rises and becomes positive relative to the cathode potential. As a result of the foregoing, a potential pattern is formed on target plate 15 substantially in proportion to the amount of light directed thereto.

When the mosaic target plate 15 is scanned with the electron beam, each semiconductor element of the mosaic is bombarded with a sufficient number of electrons to counteract the aforementioned potential difference making up the potential pattern, and hence to restore the regions 29 to the initial cathode potential, with the result that a signal voltage dependent upon the amount of light impinging on the point of the target being scanned by the beam at a particular moment is produced across the signal load resistor 24.

Referring now to FIG. 5 in which the method according to this invention is shown applied to the manufacture of transistors, it will be seen that elements similar to those described above with reference to FIG. 1 are identified by the same reference numerals, and such elements will not be further described. As shown particularly on FIG. 5A, a plurality of transistor elements 38A, 38B and 38C, each consisting of a collector region 39C, a base region 39*b* and an emitter region 39*e*, are simultaneously formed by known techniques in a single crystal semiconductor portion 4A of a vapor growth layer 4 formed by the method above with reference to described FIGS. 1A to 1C. Then, the lower portion of the resulting wafer element 7 is removed up to the plane X—X, that is, the substrate 1, and seeding site 2 are removed. Next, electrodes 37*c*, 37*b* and 37*e* are respectively deposited, through suitable openings in an oxide layer 40 and at the exposed undersurface of portion 4A, on the collector 39*c*, the base 39*b* and the emitter 39 respectively, of each transistor element in a manner to make ohmic contact therewith. Thereafter, the resulting wafer element 6 is severed into individual transistor elements by cutting along the broken lines Y—Y on FIG. 5B. This method reduces the thickness of the collector region and hence provides transistors of low collector resistance, that is, low collector power loss.

In the conventional manufacture of integrated circuits of the air-isolation type, a semiconductor wafer is etched away in a direction of its thickness between adjacent circuit elements to provide spaces therebetween. If the semiconductor wafer is thick, the etching operation is time consuming and results in the unwanted removal of those portions of the wafer underlying the mask used for etching, whereby to widen the spaces between adjacent circuit elements and hence prevent compactness and miniaturization of the integrated circuit. On the other hand, if the wafer is thin, it is liable to be broken when handled for the formation of the circuit elements or of the beam leads for electrically interconnecting the circuit elements in predetermined patterns, and in other operations. The foregoing disadvantages are avoided in the manufacture of air-isolated integrated circuits according to this invention, for example, as shown on FIG. 6 in which two diodes and one transistor constitute the illustrated integrated circuit and are air-isolated from one another.

In accordance with this invention, a semiconductor layer 4 is formed on a semiconductor substrate 1 by vapor growth techniques, in the same manner as described above with reference to FIG. 1A to 1C, after seeding sites 2′ similar to the peripheral seeding site 2 have been formed between adjacent circuit elements which will be ultimately isolated from one another. Thus, the vapor growth layer 4 is made to consist of polycrystalline semiconductor regions 4B′ overlying the seeding sites 2′ and a polycrystalline region 4B overlying seeding site 2, and three single crystal regions $4A_1$, $4A_2$ and $4A_3$ isolated from one another by the polycrystalline portions 4B′, as shown in FIG. 6A.

Following the above, an insulating material layer 5 is deposited on the vapor growth layer 4 and diodes 33 and 34 and a transistor 35 are respectively formed in the single crystal regions $4A_1$, $4A_2$ and $4A_3$ by known diffusion techniques with the insulating material layer 5 being used as a diffusion mask.

Thereafter, beam leads 36 are deposited over the insulating material layer 5 so as to electrically connect the circuit elements in a predetermined relationship, after which the substrate 1 is removed up to the plane X—X. Finally, the polycrystalline regions 4B′ of the circuit elements 33, 34 and 35 are selectively etched away to provide spaces 41 therebetween, as shown on FIG. 6B. Thus, the circuit elements are air-isolated from each other.

When the integrated circuit is manufactured according to this invention, as described above, the wafer element is of sufficient mechanical strength, due to the presence of substrate 1 during the formation of the circuit elements and the beam leads, that the wafter element is not likely to be broken. Further the polycrystalline regions 4B′ formed between adjacent circuit elements are more easily and rapidly etched than he single crystal region of the vapor growth layer, so that the previously mentioned excessive or unwanted removal of material between circuit elements can be avoided to permit the use of small spaces or gaps for the air isolation.

It will be apparent that this invention is applicable not only to the making of semiconductor wafers for forming the aforementioned vidicon-target, integrated circuits and independent semiconductor elements, as described above, but also to the making of semiconductor wafers for forming other devices.

In the foregoing examples, each single crystal semiconductor region 4A of the wafer element is surrounded by a polycrystalline semiconductor region 4B formed when the vapor growth layer 4 is deposited on the seeding site 2 which extends above the substrate surface. However, it is also possible to adopt the following variation of the described method. A recess is formed in the substrate 1 at the marginal portion of its surface 1*a* and the seeding site 2 is formed in the recess. Then, a semiconductor vapor growth layer is formed on the seeding site 2 and on the surface 1 *a* of the substrate 1, after which the substrate 1 is ground from its underside up to remove the seeding site 2.

Although various specific embodiments of the invention and certain modifications thereof have been described in detail herein with reference to the accompanying drawing, it is to be understood that the invention is not limited to those precise embodiments and modifications thereof, and that various other changes and modifications may be effected by one skilled in the art without departing from the scope or spirit of the invention.

What is claimed is

1. A method of making a semiconductor wafer comprising the steps of forming on the marginal portion of a single crystal semiconductor substrate a seeding site which is crystallographically different from said substrate and which presents a continuous seeding site surface bounding a surface of said substrate at one side of the latter, forming on said surfaces of the seeding site and substrate a vapor growth layer of the same conductivity type as said substrate and consisting of a continuous polycrystalline region overlying said seeding site surface and surrounding a single crystal region directly overlying said substrate at said surface of the latter, and removing at least said servoconductor substrate from said vapor growth layer so as to leave a semiconductor wafer of a maximum thickness substantially determined by the thickness of said vapor growth layer.

2. The method according to claim 1, in which an impurity of opposite conductivity type to said substrate is diffused into said single crystal region of the vapor growth layer to form therein semiconductor elements having at least one PN junction.

3. The method according to claim 2, in which said impurity is diffused into said single crystal region prior to the removal of said semiconductor substrate from the vapor growth layer.

4. The method according to claim 2, further comprising the step of forming leads on said semiconductor wafer for interconnection of said semiconductor elements and for external connections to the latter.

5. The method according to claim 2, in which said seeding site is removed with said semiconductor substrate from said vapor growth layer.

6. The method according to claim 2, in which said substrate is of a high impurity type so that the impurity concentration in said single crystal region of the vapor growth layer increases across the thickness thereof in the direction toward said substrate.